United States Patent [19]
Casper et al.

[11] Patent Number: 5,155,547
[45] Date of Patent: Oct. 13, 1992

[54] POWER CONTROL CIRCUIT FOR INDUCTIVELY COUPLED PLASMA ATOMIC EMISSION SPECTROSCOPY

[75] Inventors: Ted J. Casper, Berrien Springs; Joel C. Mitchell, Bridgman; Gordon C. Ford, St. Joseph, all of Mich.

[73] Assignee: Leco Corporation, St. Joseph, Mich.

[21] Appl. No.: 485,173

[22] Filed: Feb. 26, 1990

[51] Int. Cl.$^5$ .............................. G01J 3/30
[52] U.S. Cl. .............................. 356/316
[58] Field of Search .............................. 356/315, 316; 315/111.21, 111.51; 313/231.31; 219/121.57, 121.54

[56] References Cited

U.S. PATENT DOCUMENTS

4,482,246 11/1984 Meyer et al. .............................. 356/316
4,591,267 5/1986 Demers et al. .............................. 356/316
4,629,940 12/1986 Gagne et al. .............................. 356/316

Primary Examiner—Davis L. Willis
Assistant Examiner—K. P. Hantis
Attorney, Agent, or Firm—Price, Heneveld, Cooper, DeWitt & Litton

[57] ABSTRACT

A multiple frequency plasma torch activation circuit includes a system driver circuit with a pair of different frequency sources and a selector switch which allows one of the sources to be coupled to a splitter assembly which applies signals to a pair of independent power amplifiers having their outputs applied to a combiner assembly and to the plasma torch inductor. A detector circuit provides signals to a power control circuit which includes forward and reflected power monitoring and an impedance matching circuit for optimum coupling of the frequencies to the inductive load.

20 Claims, 3 Drawing Sheets

POWER CONTROL CIRCUIT FOR INDUCTIVELY COUPLED PLASMA ATOMIC EMISSION SPECTROSCOPY

BACKGROUND OF THE INVENTION

The present invention pertains to a plasma atomic emission spectroscope and particularly to a power control circuit therefore.

Inductively coupled plasma atomic emission spectroscopy analysis is a technique for determining major, minor and trace elemental constituents of liquid samples. This technique is based upon a generation of an inductively heated plasma utilizing RF energy. Liquid samples are converted into an aerosol utilizing a nebulizer and injected into a plasma. As a sample enters the plasma, it undergoes desolvation, volatilization, atomization, excitation and finally emits photons characteristic of wavelengths of elements present in the sample. The intensity of the emission at the characteristic of the wavelengths is used to determine the concentration of a element present in the sample while the wavelengths themselves determine what elements are present. The plasma is typically supported by an argon gas, but other gases may also be employed. The most commonly used frequency for maintaining the plasma has been 27.12 Mhz, however, recently other frequencies including 40.68 Mhz have been employed.

The equipment available to date for activating the plasma torch for such spectroscopes includes single frequency excitation systems, which although working well with certain samples, does not provide the flexibility of providing optimum plasma excitation for different samples. Thus for example, alkali elements such as sodium, lithium and potassium can be adequately excited at a frequency of 27.12 Mhz providing a plasma temperature of 6000°-8000° K. while metal, such as aluminum, tungsten, molybdenam and iron are better excited at a higher temperature plasma available with an excitation frequency of 40.68 Mhz which provides a plasma temperature in the range of 6,000°-10,000° K. The dual frequency system also allows flexibility in analyzing samples dissolved in various solvents such as water or organic solvents. The frequency available for use with such equipment is limited by FCC regulations and therefore, not a great deal of flexibility is available for experimentation on excitation frequencies. In the past, commercially available instruments, such as manufactured by Henry Radio, model no. Henry-2000-D-40, have provided a single excitation frequency. Some attempts have been made to provide multiple frequency operation by physically changing tank circuit components which is both time consuming, expensive and somewhat difficult inasmuch as the output of the excitation or power control circuit terminates into an induction coil for the plasma which remains the same, for the multiple frequencies. Thus it has been difficult to provide a single instrument with dual frequency characteristics for the optimum plasma excitation for the different elements and different solvents.

SUMMARY OF THE PRESENT INVENTION

The system of the present invention overcomes the problems of the prior art by providing a multiple frequency system in which the user can optimize all source conditions utilizing operating frequencies suitable for the various sample types involved. In the preferred embodiment of the invention, a dual frequency system is provided without the need for physically changing components of the plasma generator. In a preferred embodiment of the invention, the system accomplishes this goal by providing a driver assembly coupled to a splitter assembly which applies signals to a pair of independent power amplifiers having their outputs applied to a combiner assembly and subsequently to a torch box containing the inductive load. An ignition detector assembly provides signals to a system microprocessor, which in turn, optimizes the impedance matcher to provide maximum load coil current for ignition. Forward and reflected power monitoring and assures optimum coupling of the activating frequency signals to the inductive load.

With such a system therefore multiple frequency operation is possible while the control of the plasma at a selected frequency is carefully maintained. These and other features, objects and advantages of the present invention, will become apparent by reading the following description thereof together with reference to the accompanying drawings in which:

DETAILED DESCRIPTION OF THE PREFERRED EMBODIMENT

Figure 1:
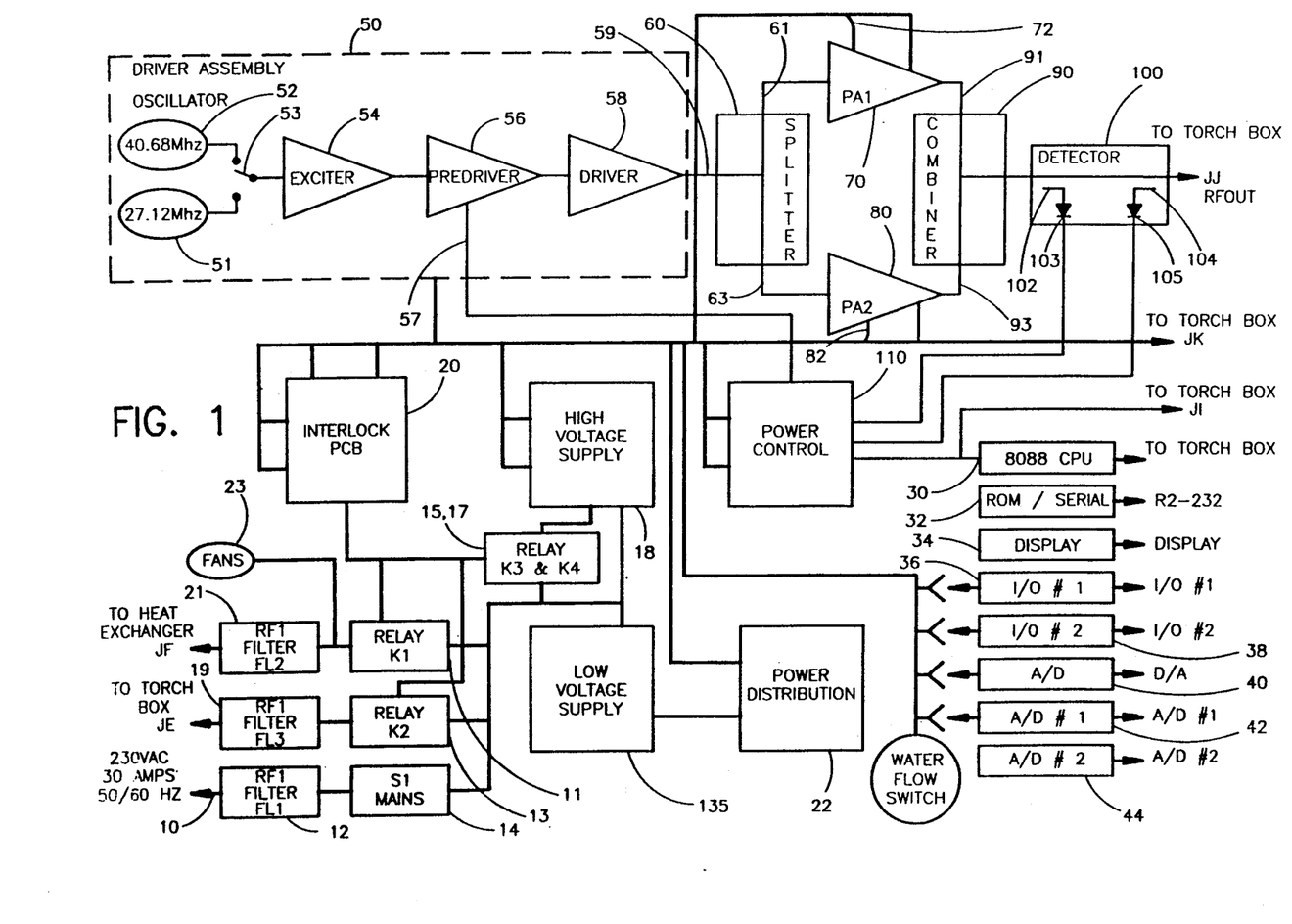
FIG. 1 is an electrical circuit diagram in block form of the electrical control system of the present invention.
Figure 2:
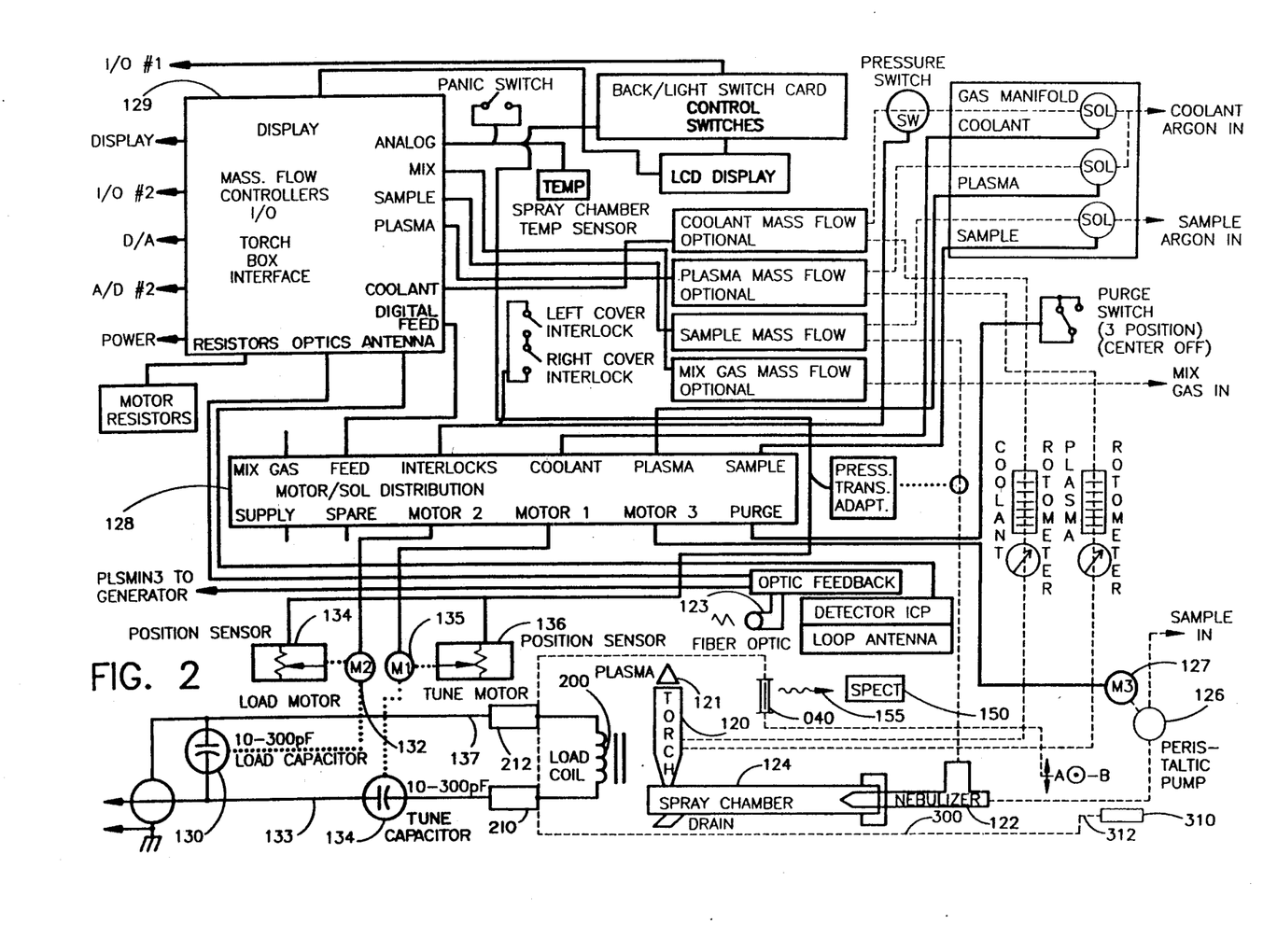
FIG. 2 is an electrical and mechanical diagram in block form of the plasma torch and associated control system of the present invention which interfaces with the circuitry shown in FIG. 1.

Referring initially to FIG. 1, power for the system is supplied by a 230 volt AC line 10 coupled to the main power switch 14 by means of a RFI filter 12 which blocks RF energy from the power control system from entering the 230 volt line. The AC voltage is applied to a low voltage supply 16 and a high voltage supply 18 which are coupled to the associated circuit components by a variety of electrical conduits shown as bus lines in the block diagrams and coupled in a conventional manner utilizing terminal strips and connectors as illustrated. The low voltage supply provides +5 volts DC, + or −15 volts DC and +24 volts DC for the electrical circuits while the high voltage supply provides 25 to 50 volts DC current to the driver circuit and power amplifiers only when the RF drive is activated. The 230 volt AC power is also coupled to relays 11, 13, 15 and 17 as shown in the diagram with relay 11 controlling the application of the 230 volt AC power to the heat exchanger and cooling fans of the generator as illustrated in FIG. 2. Relay 13 is employed to control the application of 230 volt power to the torch box shown in FIG. 2 while relays 15 and 17 are coupled to the interlock circuit 20 to disable the system if any of the system's interlocks are broken or if insufficient cooling water flow is detected. The power applied to the torch box by relay 13 is filtered by an RF filter 19 while power to the heat exchanger from relay 11 is filtered by a RFI filter 21. Cooling fans 23 are also coupled to relay 11 for providing cooling for the cabinetry in which the power system is mounted.

The low voltage supply 16 is coupled to a power distribution circuit 22 which distributes the low voltage power to the respective circuits. Also circuit 22 serves as a ground reference for all DC currents in the system. It is to be understood that the coupling of the power supply to the individual circuits is not shown for the sake of clarity but is accomplished in a conventional manner utilizing the bus interconnections illustrated.

The heart of the control system is an 8088 CPU 30 intercoupled with the ROM/serial program memory and interface circuit 32 which in turn is coupled to a 4-line digital display circuit 34. Two input/output port cards 36 and 38, each provide 16 digital output lines for control output signals and 16 digital input lines for monitoring signals. A digital-to-analog converter 40 provides up to 12 output channels of analog information while a pair of analog-to-digital converters 42 and 44, each provide 16 input channels. Each of the circuits 32–44 are coupled to the microprocessor 30 to provide control output signals and data input signals from the various circuit components described below.

The power control circuit of FIG. 1 includes a driver assembly 50 providing one of a plurality of different frequency signals to a splitter circuit 60 which divides the input signal into two equal amplitude output signals applied to power amplifiers 70 and 80 which separately apply their output signals to a combiner circuit 90 and to the torch box through interconnection JJ through a detector assembly 100. A power control circuit 110 is coupled to the detector assembly 100 and to the driver assembly 50 for controlling the RF signal applied to the torch induction coil 200 (FIG. 2) as described in greater detail below in connection with the description of the power control circuit. The spectroscope is shown in FIG. 2 and includes a torch 120 which is commercially available and typically includes a composite of coaxial quartz tubes which are used to control and contain the plasma itself. It is also employed for injecting the sample into the plasma through a nebulizer 122 and spray chamber 124. The sample is injected into the nebulizer by a peristaltic pump 126 driven by control motor 127. Motor 127 is controlled through a distribution panel 128 coupled to the torch box interface circuit 129 coupled as indicated by the interconnecting conductors to the control circuit of FIG. 1 and particularly to the interface circuits 34–44.

Coupled in circuit with the load coil 200 providing RF energy to initiate and sustain the plasma in torch 120, is a load capacitor 130 which is a motor tuned 10 to 300 pF 10,000 volt vacuum capacitor adjusted by motor 132 having a position sensing resistor 134 coupled thereto such that the capacitor position can be supplied to the computer through interface 129 and distribution panel 128. Capacitor 130 tunes the impedance characteristics of the transmission line intercoupling the circuits of FIGS. 1 and 2 to the load coil impedance for maximum transmission of energy. A tuning capacitor 134 is coupled in series with the RF supply conductor 133 and coil 200 and is a motor adjusted 10–300 pF 15,000 volt vacuum capacitor driven by a motor 135 coupled to a position sensing resistor 136. Capacitor 134 is selectively driven to resonant the load coil 200 with the RF frequency being applied through the power circuit of FIG. 1 to maximize the power transferred to the plasma represented schematically at 121 in FIG. 2.

The torch control shown in FIG. 2 also includes a variety of secondary control and monitoring detectors switches and displays as shown in FIG. 2 the functions of which are readily apparent from the FIG. without a detailed description thereof and which are peripheral to the invention claimed herein. As a result they are not specifically described. The system includes a cabinet 300 (shown schematically) with an optical path 140 to allow optical coupling of a spectrometer 150 to the plasma 121. The load coil assembly 200 can be moved along two axes which are perpendicular to the optical axes as seen by arrows A and B in FIG. 2 by an adjustment mechanism 310 as described below for viewing different portions of the plasma. Having briefly described the overall system components, a detailed description of the principle electrical circuits of the overall control system is now presented.

The heart of the multiple frequency control system is the driver circuit 50 which in the preferred embodiment provides two different frequencies for the plasma activation. In other embodiments other different frequencies may be employed or more than two could be supplied. The driver assembly includes in the preferred embodiment a first frequency source comprising a crystal controlled oscillator 51 having a crystal stabilized frequency of 27.12 Mhz and a second crystal controlled oscillator 52 having a crystal stabilized frequency of 40.68 Mhz. The oscillators can be conventional crystal controlled oscillators for determining these two operating frequencies and each provide approximately a 1 miliwatt output signal which can be operator selected through computer control in response to acuation of a control represented in FIG. 1 as a frequency selector switch 53 such that either of the two frequencies can be selected for a given sample.

The selected frequency is applied to the input of an exciter amplifier 54 which amplifies the signal to approximately a 1 watt level. The output signal from the exciter amplifier 54 is applied to a variable gain predriver amplifier 56 having a control input terminal 57 for varying the gain of the amplifier to compensate for plasma load changes and other gain variations within the system. The typical output power for the predriver amplifier is approximately 3 watts with the input signals for adjusting the gain of the predriver amplifier coming from the power control circuit 110 which operates as described in detail below in connection with FIG. 3.

The output signal from the predriver amplifier 56 is applied to a driver amplifier 58 which is a power amplifier increasing the power of the selected plasma activating frequency to approximately 120 watts. The driver amplifier includes harmonic suppression through the incorporation of an output transformer tuning capacitor and a small series inductor, the second harmonic of the 27.12 Mhz signal is reduced to less than 30 dB from the desired signal. The driver assembly including amplifier 54–58 includes suitable resistance feedback to stabilize the amplifier against spurious oscillation. The negative feedback employed is reduced at the operating frequencies through the use of band stop filters to provide maximum gain at the desired frequencies and excellent stability at other frequencies. The resultant excitation signal from the driver assembly 50 is applied to the input of splitter circuit 60 by means of a coaxial cable 59.

The excitation signal from driver 58 applied to splitter 60 is divided into two in-phase equal amplitude signals for application to the power amplifiers 70 and 80. Inasmuch as the load changes with the characteristic of the plasma itself, it is important that the signals are in-phase to guarantee that the output of the amplifiers are closely matched to reduce power hogging by one or the other of the power amplifiers. Thus the splitter is designed to assure equal phase and amplitude output signals to the inputs of amplifiers 70 and 80. The splitter is a transformer-type splitter designed to assure the RF signals output at terminals 61 and 63 are in-phase with one another.

The two output signals from splitter 60 are amplified by power amplifiers 70 and 80 to provide 1072 watt power output level for each amplifier. Each of the circuits 70 and 80 include solid state components and thermal protection circuits against over loading. They utilize push-pull amplifiers in order to minimize even harmonics. The 1072 watt output signals of equal frequency and identical phase are applied to input terminals 91 and 93 of combiner circuit 90 which combines the two input signals into a 2000 watt output signal applied to the load coil 200 of FIG. 2. The combiner circuit 90 includes filtering necessary to suppress harmonic energy remaining in the signal such that they are less than 40 dB below the desired carrier frequency. Through the transistor characteristics of the transistor power amplifiers used in the push-pull power amplifiers 70 and 80, the harmonic content of the signal is less than 45 dB above 100 Mhz and filters are only necessary therefore for frequencies below 100 Mhz.

Figure 3:
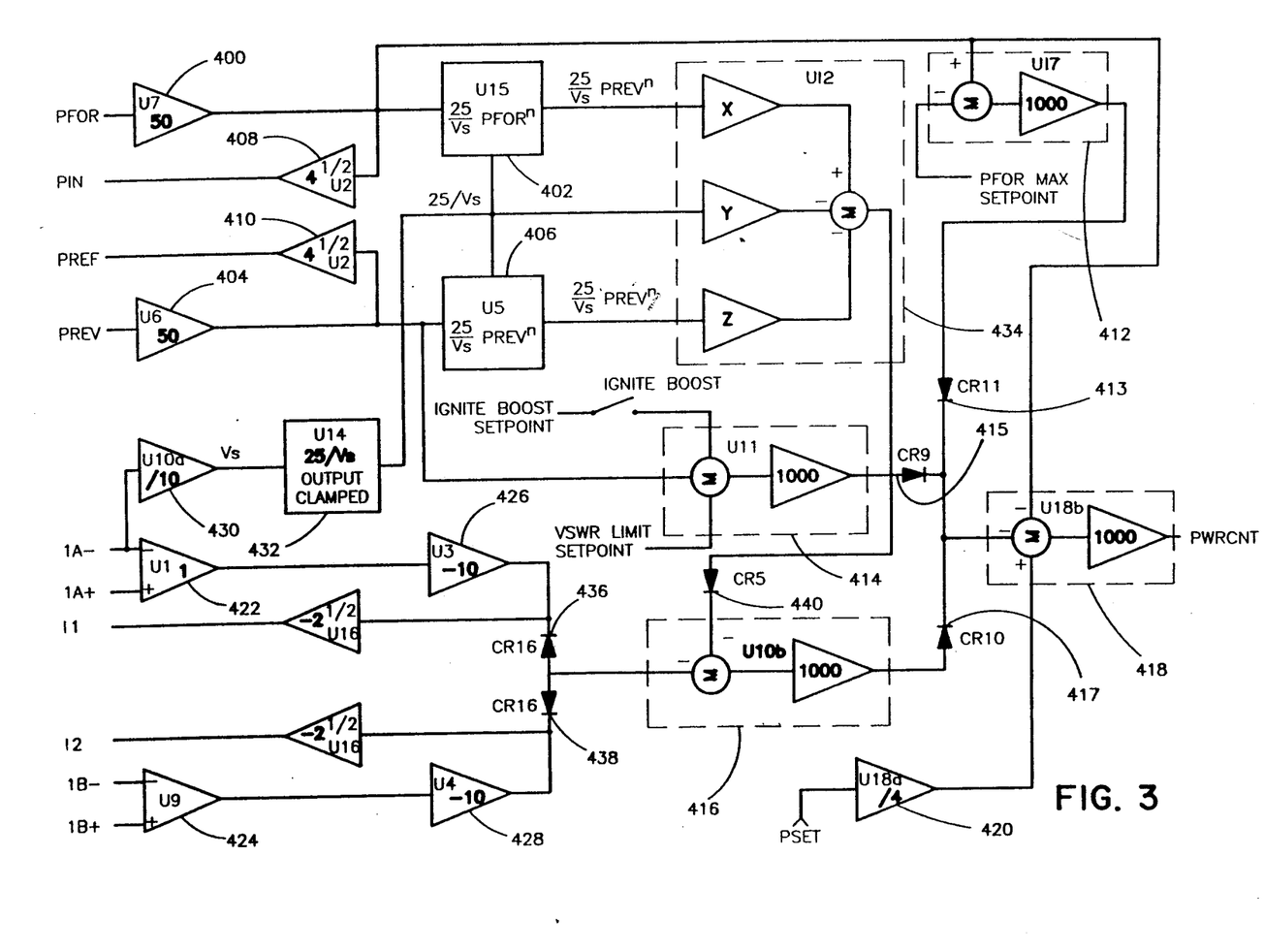
FIG. 3 is an electrical circuit diagram in schematic form of the power control circuit shown in block form in FIG. 1.

In the combiner, the harmonic filtering typically would be done by a low pass filter, however, the current and voltage levels which would result in such high power applications could be excessive requiring extremely expensive components to sustain. The losses of a low pass filter would also require extra power from amplifiers 70 and 80. As a result, a pair of series traps are inserted between the combined output winding of the transformer of the combiner circuit and its output terminal. One of the traps is tuned to 54.24 Mhz which is the second harmonic of the 27 Mhz activating signal and the second is tuned to 81.36 Mhz which is the third harmonic of the activating signal and the second harmonic of the 40 Mhz activating signal to maintain the harmonic level at the output of the combiner at 40 dB or greater below the 2000 watt carrier signal. The insertion loss of the dual trap method and the combiner transformer is less than 0.3 dB. The 54 Mhz trap comprises a 22 nH coil in parallel with a pair of parallel 200 pF capacitors. The 81 Mhz trap comprises a 34 nH coil and parallel with a pair of parallel coupled 56 pF capacitors. The two filter traps are serially coupled to the secondary winding of the split transformer. The resultant signal is the 2000 watt carrier frequency signal at on of the selected frequencies determined by the position of switch 53 and is applied to the detector assembly 90 which includes a forward power and reflected power probe 102 and 104 respectively providing input signals to the power control circuit 110 indicating the standing wave ratio of the energy applied to the load coil 200. For providing a DC control signal, RF diodes 103 and 105 are provided in association with probes 102 and 104 to provide a DC control signals for the power of control 110. The power control module is shown in FIG. 3 for describing the circuitry of FIG. 3, however; a brief description of the overall methodology employed in protecting the high powered amplifier is presented.

A method is disclosed for preventing destruction of RF power devices based on supply current, supply voltage, and actual output power. Signals representing the forward RF power and reverse RF power from circuit 100 and signals from the supply current and supply voltage sources 16 and 18 are used as feedback to maintain the RF power amplifiers 70 and 80 in a desired and safe operating range. The voltage representing the reverse RF power from detector 104 is also used to keep the total RF system at safe current and voltage levels. If the power dissipation and reverse RF power are within limits, the voltage representing the forward RF power from probe 102 is used to maintain a desired RF output at an externally commanded level.

It is well understood that the lifetime of a solid state device is inversely proportional to its operating temperature. Therefore it is desirable to limit the maximum junction temperature of a solid state device such as used in amplifiers 70 and 80 in order to guarantee long life. Usually an RF amplifier is designed to operate into a 50 Ohm resistive load. If this resistive load changes value, the operation of the amplifier is changed. With certain load impedances connected to the RF amplifier, the power conversion efficiency can be reduced to a point that the maximum junction temperature of the device is exceeded resulting in failure.

One common method of limiting junction temperature is through the use of a thermal switch. This method however does not respond to instantaneous temperature changes due to the thermal mass of the switch and surrounding structures. Another method of protection can be provided by limiting the supply current to the device. This method cannot guarantee a safe operating temperature since the output power from the device is not known.

However, by incorporating the correct feedback signals, a method of current limiting can be achieved that limits the maximum operating temperature of the device regardless of the load impedance.

It can be shown that the power dissipated in the device is related to the equation:

$$Pdis = V*I + Pdrv - Pfor + Prev \qquad (1)$$

where:
Pdis = Power dissipated in device
V = supply voltage
I = supply current
Pdrv = input RF drive power
Pfor = RF output power moving towards load
Prev = RF power returned to device due to mismatch at load From the thermal resistance of the device and the thermal resistance of the heat sink, a value for Pdis can be calculated that will satisfy the maximum junction temperature of the device.

$$Tj = Pdis*(Rjc + Rcs + Rsa) + Ta \qquad (2)$$

where:
Tj = the junction temperature of the device
Rjc = the thermal resistance of the device
Rcs = the thermal resistance of the case to heat sink interface
Rsa = the thermal resistance of the heat sink from mounting surface to ambient air
Ta = the ambient room temperature Rearranging equation 2 and solving for Pdis yields:

$$Pdis = (Tj - Ta)/(Rjc + Rcs + Rsa) \qquad (3)$$

Using worst case values with equation 3 will result in a solution for the maximum power that can be dissipated in the device without exceeding the desired junction temperature.

Solving equation 1 for the current that would achieve the desired maximum operating temperature yields:

$$I = (Pdis - Pdrv - Prev + Pfor)/V \quad (5)$$

The power control module 110 of FIG. 3 as explained below synthesizes equation 5 and adjusts the drive level to the power amplifiers to satisfy equation 6.

$$I \leq (Pdis - Pdrv - Prev + Pfor)/V \quad (6)$$

If a worst case value for Pdrv can be determined, (usually this can be accomplished since the drive stage has a maximum output) the first two terms of equation 6 can be combined.

$$I \leq (Pdist - Prev + Pfor)/V \quad (7)$$

where: Pdist = Pdis − Pdrv
separating equation 7 into terms yields:

$$\leq Pfor/V + Pdist/V - Prev/V \quad (8)$$

It is also understood that high reflected power in a system will cause hot spots and high voltage points in an RF system. Therefore it is important that the magnitude of the reflected power does not cause failure of system components. The power control module 110 limits the value of the reflected power to a safe operating range. This safe operating range can be extended for short time periods if:
1. The peak RF voltages in the system are still below the safe operating range of all the components.
2. The temperature of all components remain within the safe operating range as calculated by thermal time constants, and thermal resistances.

The power control module allows for the reflected power limit to be increased for short periods of time. This feature is useful in applications requiring high power short duration bursts such as encountered in plasma generation. It should be noted that the current regulator of the power control will not allow the power transistors to draw damaging levels of current even if the reflected limit is increased.

Another problem frequently encountered in solid state RF power generation is burn out due to excess RF output. This problem is overcome in the power control module through the use of an RF output power limiter. This limiter will keep the RF output power at or below the burnout point in case of operator error. Having described the background theory of the solid state amplifying means and the protection required for plasma generation, a description of the control circuit of FIG. 3 follows beginning with a description of the input and output signals.

REQUIRED INPUTS

PFOR = a voltage signal that represents the forward RF output of the device to be protected. Note: for multiple device systems, this can be the total combined power as long as all devices share equally. (In-phase or 180 degree combining.) This signal can be generated through the use of commercially available couplers and detectors.

PREV = a voltage signal that represents the reflected RF power. (Power returned back to the device from the load due to the mismatch of impedances.) Note: for multiple device systems, this can be the total reflected power as long as all devices share equally. (In-phase or 180 degree combining.) These signals are generated through the use of commercially available couplers and detectors 102-105 (FIG. 1).

IA = a differential voltage representing the current draw of the device to be protected. The − side of this differential voltage should be at the same potential as the supply output voltage. This signal can be generated by inserting a small value resistor in the DC supply line.

IB = a differential voltage representing the current draw of the second device to be protected. (Used for multiple device systems.)

PSET = The desired RF output power setpoint established by operator.

IGNITE = A control voltage used to enable the ignite boost.

OUTPUT SIGNALS

PIN = The measured forward output power of the device or system sent to monitor or meter.

PREF = The measured reflected power of the device or system sent to monitor or meter.

PWRCNT = The error output voltage used to control the magnitude of the RF drive power into the device or system.

THEORY OF OPERATION

Referring to FIG. 3, amplifier 400 increases the amplitude of the PFOR signal to a level convenient for application to analog computational unit 402. Amplifier 404 increases the amplitude of the PREV signal to a level convenient for application to a second analog computational unit 406. Amplifiers 408 and 410 serve as buffers to the power monitor or meters.

Under normal operating conditions, (absence of: current limit, VSWR limit and PFOR MAX limit), the outputs of summing amplifiers 412, 414 and 416 are negative and thus are electrically disconnected from amplifier 418 through diodes 413, 415 and 417 respectively. When a positive reference is applied to PSET the output of amplifier 420 is applied to the summing node of amplifier 418. This forces the PWRCNT signal positive which in turn causes the drive power to the RF device to increase. This increase in RF drive produces an RF output which in turn generates a voltage at the detector 100. (PFOR) PFOR is amplified by amplifier 400 and subtracted at the summing node of amplifier 418. The value of PWRCNT will adjust itself to match the outputs of amplifiers 400 and 420. The value of PFOR will track PSET as long as PWRCNT is able to change the gain of the RF system.

Amplifiers 422 and 424 are differential amplifiers with high common mode rejection. The output of amplifier 422 is proportional to the current input to the first power amplifier 70. Likewise the output of 424 is proportional to the current input to the second amplifier 80. Amplifiers 426 and 428 amplify the outputs of 422 and 424 respectively to provide an output voltage that is therefore proportional to the device currents. The value of the sense resistor used and the gain of amplifiers 426 and 428 establish a amp/volt relationship between device currents and the voltage output of these amplifiers where:

$$V(426) = Rs * I * GAIN(426) \quad (9)$$

$$V(428) = Rs * I * GAIN(428) \quad (10)$$

where: Rs = the value of the sense resistors.

Amplifier 430 divides the DC supply voltage to a convenient value for application to another analog computational unit 432. The output of amplifier 430 is therefore proportional to the DC supply voltage. Units 402, 406 and 432 are real time analog computational units capable of performing multiplication, division, power and root functions. They are able to perform their mathematical calculations at a rate faster than the desired response time of the power control system. Unit 432 outputs a signal that is inversely proportional to the supply voltage and thus provides the denominator value for the above equation 7. The output voltage of unit 432 is limited to a value that will result in a device current less than the manufactures specified limit.

The power and root functions are utilized in circuits 402 and 406 to linearize the detector characteristics so an RF power change of 2 results in a doubling of their output voltage. This linearized power curve is then multiplied by the output of circuit 432. The output of 402 is therefore proportional to the forward output power and inversely proportional to the DC supply voltage. Likewise circuit 406 outputs a signal that is proportional to the reflected power in inversely proportional to the DC supply voltage.

The scaling and summing amplifier 434 is used to synthesize equation 8 completely. This is done by scaling each of the terms by a factor that will provide a amp/volt gain equivalent to the current monitor circuit of 422-426 or 424-432 explained above. The individual terms are scaled by factors X, Y and Z. The scaling and summing of these signals can be accomplished with a summing amplifier with each input having a different gain value. The output of circuit 434 generates the function:

$$V(434) = X*(25/Vs)*PFOR^n + Y*(25/Vs) + Z*(25/Vs)*PREV^n \quad (11)$$

The "25" in equation (11) is due to internal reference voltage of circuit 432. This value could be any convenient number.

The output of circuit 434 therefore is a solution to equation 8 once X, Y and Z are chosen for the specific application. Since the right hand terms of the equation are not dependent on each other, the solutions for X, Y and Z can be found independently. For instance, if the desired amp/volt ratio is 1, the value of X must satisfy the first term of equation 8.

$$Vs = V/10 \quad (12)$$
$$PFOR^n = Pfor \quad (13)$$

Therefore the contribution to I due to Pfor is:

$$V(434) = X*(250/V)*Pfor \quad (14)$$

If the 1 amp per volt gain is to be maintained X must take on the value of 1/250 yielding:

$$V(434) = Pfor/V \quad (15)$$

Likewise the gains of Y and Z can be adjusted to satisfy equation 8 along with the amp/volt gain of the current monitor. It should be noted that equation 15 assumes only one device in operation. If multiple devices are used, the value for PFOR$^n$ in equation 13 is adjusted for the number of parts and loss in the combiners. Also equation 13 assumes a 1 to 1 correspondence in PFOR n and the actual output power. This is not usually the case therefore 13 would have to be adjusted for this factor.

The output of circuit 426 is compared against that of circuit 428 by diodes 436 and 438. The greater value is applied to the summing node of circuit 416. Also, the output of circuit 434 is applied to the summing node of circuit 416 through diode 440 which is used to duplicate the voltage drop of diodes 436 or 438. The output of circuit 416 is therefore the difference between the current monitor signal and the calculated value for the maximum safe operating current. If the current monitor level is above the maximum safe operating current, the output of circuit 416 will go positive thus reducing the PWRCNT voltage until the monitored current and the output of circuit 434 are equal. If the monitored current is below the maximum safe operating current, the output of circuit 416 is negative and diode 417 isolates circuit 416 from circuit 418.

The output of amplifier 404 is applied to the summing node of amplifier 414. This voltage has subtracted from it a value equal to the voltage that amplifier 404 would generate at the desired maximum reflected power limit. For instance, if the maximum reflected power level results in an output of 1 volt for amplifier 404, a 1 volt signal is subtracted from its output. Therefore, if the output of amplifier 404 is less than the VSWR limit setpoint, the output of circuit 414 is negative and it is electrically disconnected from circuit 418 by diode 415. If the output of amplifier 404 is greater than the VSWR limit setpoint, the output of circuit 414 swings positive thus reducing the value of PWRCNT. PWRCNT will continue to drop therefore until the output of amplifier 404 is equal to the VSWR limit setpoint which in the preferred embodiment is selected for a maximum reflected power of 300 watts. The addition of an increase VSWR limit for short durations is accomplished by subtracting the appropriate voltage in circuit 414. The use of a timed switch can eliminate any concern of the IGNITE BOOST SETPOINT being applied continuously.

Maximum output power limiting is accomplished in a similar manner. The output voltage of amplifier 400 at the desired output power limit should be applied to the PFOR MAX SETPOINT. If the output of amplifier 400 is less than the limit voltage, circuit 412 swings negative and is disconnected from circuit 418 by diode 413. If the value of PFOR becomes excessive the output of amplifier 400 will increase above the PFOR MAX SETPOINT and circuit 412 will swing positive thus reducing PWRCNT. PWRCNT will continue to decrease until the output of amplifier 400 becomes equal to PFOR MAX SETPOINT.

The application for the power control module shown in FIG. 3 is the plasma control of FIGS. 1 and 2 which it shows a dual frequency plasma generator used for an ICP source. The detected signals PFOR and PREV are generated by BIRD power meter components. The DC power for the RF modules is generated in the high voltage supply 18 (FIG. 1). The supply voltage can be set between 25 and 50 volts. The differential current signals IA and IB are developed across 0.005 ohm resistors. The PWRCNT signal is used to control the gain of a power MOSFET. Each PA module 70 and 80 contains two 600 watt transistors working in push-pull configuration. The total RF output power is limited to 2100 watts by the PFOR MAX SETPOINT. The reflected power limit is set to 300 watts with a one second pulse value of 625 watts.

In addition to controlling the power supplied to the load coil, the torch assembly can be moved such that different portions of the plasma flame 121 are positioned in the optical path. For such purpose, the torch 120, coil, 200 spray chamber 124 and nebulizer 122 are mounted in fixed relationship to one another as is the fiber optic sensor 123 which provides a signal indicating that the plasma is on. A mechanical adjustment control 310 as shown in block form is connected at 312 to assembly 300 for providing this dual axes adjustment. The controls can take on a variety of forms such as a rack and pinion drive, a screw jack adjustment or other suitable and conventional mechanical adjustment means.

In order to couple the load coil 200 to the conductor 133 and return conductor 137 allowing its movement, flexible couplings 210 and 212 are provided which are comprised of two inch flexible straps each being three sections of braided copper which are silver plated to minimize their losses. This allows adjustment of the moveable torch assembly 300 which includes load coil 200 with respect to the impedance matcher which includes capacitors 134 and 130 such that the torch assembly can be moved with respect to the spectrometer 150 such that the optical energy 155 from plasma 121 can be selected for the desired optical signal information. The spectrometer 150 can be any typical optical spectrometer and forms no part of the present invention.

It will become apparent to those skilled in the art that various modifications to the preferred embodiment of the invention as described herein can be made without departing from the spirit or scope thereof as defined by the appended claims.

The embodiments of the invention in which an exclusive property or privilege is claimed are defined as follows:

1. A multiple frequency activating circuit for an inductively coupled plasma generator comprising:
    a source of at least first and second excitation frequency signals wherein said at least first and second frequency signals are of different frequencies with each frequency selected for providing at least first and second plasma characteristics;
    means coupled to said source for selecting one of said first or second frequency signals;
    means coupled to said selecting means for amplifying a selected frequency signal to a level sufficient to initiate and sustain a plasma in a plasma torch; and
    an induction coil associated with a plasma torch and means for coupling said induction coil to signal amplifying means.

2. The circuit as defined in claim 1 wherein said source comprises at least two separate oscillators for providing said first and second excitation frequency signals and said selecting means comprises a selector switch for selectively coupling one of said oscillators to said amplifying means.

3. The circuit as defined in claim 2 wherein said amplifying means includes a preamplifier having at least one variable gain amplifier section with a control input terminal and means for providing a control signal to said terminal of said variable gain amplifier to compensate for gain variations in the system and for plasma load changes.

4. The circuit as defined in claim 3 wherein said preamplifier includes three series coupled stages of amplifiers and said variable gain amplifier is the second amplifier of said stages of amplifiers.

5. The circuit as defined in claim 1 wherein said amplifying means includes a signal splitter for dividing the selected frequency signal into two substantially equal amplitude signals.

6. The circuit as defined in claim 5 wherein said amplifying means further includes a pair of power amplifiers each having input and output terminals and wherein one of said equal amplitude signals is applied to the input terminal of one of said power amplifiers and the other of said equal amplitude signals is applied to the input terminal of the other of said power amplifiers.

7. The circuit as defined in claim 6 wherein said amplifying means further includes a combiner circuit having a pair of input terminals and an output terminal wherein one of said input terminals of said combiner circuit is coupled to said output terminal of one of said power amplifiers and the other of said input terminals of said combiner circuit is coupled to said output terminal of the other of said power amplifiers.

8. The circuit as defined in claim 7 wherein said combiner circuit includes trap circuit means for trapping harmonic frequencies of at least one of said first and second excitation frequency signals.

9. The circuit as defined in claim 8 wherein said means for providing activating signals includes flexible conductors coupled to said terminals of said induction coil to allow movement of said coil with respect to said means for providing activating signals.

10. The apparatus as defined in claim 9 wherein said flexible conductors comprise silver plated braided copper conductors.

11. The circuit as defined in claim 8 wherein said trap means comprises first and second trap filters having a frequency corresponding to a second harmonic frequency of at least one of said excitation frequency signals.

12. A plasma generator and spectrometer comprising:
    a plasma torch;
    a spray chamber coupled to said torch;
    a sample nebulizer coupled to said spray chamber;
    an induction coil coupled to said torch and including terminals for receiving activating electrical signals;
    means for providing activating signals to said terminals of said induction coil, wherein said means for providing activating signals includes flexible conductors coupled to said terminals of said induction coil to allow movement of said coil;
    a cabinet for housing said torch, spray chamber, nebulizer and said induction coil; said cabinet including an optical path aligned with said torch;
    an optical spectrometer mounted to receive optical information through said path; and
    means for moving one of said torch assembly and spectrometer with respect to the other such that said spectrometer can view different portions of a plasma generated in said torch, wherein said moving means comprises means for moving said torch assembly with respect to said spectrometer.

13. The apparatus as defined in claim 12 wherein said means for providing activating signals further includes a source of at least first and second different frequency excitation frequency signals wherein each frequency is selected for providing at least first and second plasma characteristics; means coupled to said source for selecting one of said first or second frequency signals; means coupled to said selecting means for amplifying a selected frequency signal to a level sufficient to initiate and sustain a plasma in a plasma torch; and means coupling said flexible conductors to said signal amplifying means.

14. The apparatus as defined in claim 13 wherein said flexible conductors comprise silver plated braided copper conductors.

15. A multiple frequency activating circuit for an inductively coupled plasma generator comprising:
- a source of at least first and second excitation frequency signals wherein said at least first and second frequency signals are of different frequencies with each frequency selected for providing at least first and second plasma characteristics;
- means coupled to said source for selecting one of said first or second frequency signals;
- means coupled to said selecting means for controllably amplifying a selected frequency signal to a level sufficient to initiate and sustain a plasma in a plasma torch;
- an induction coil associated with a plasma torch and means for coupling said induction coil to signal amplifying means;
- detector means coupled to said amplifying means to provide signals representing the power transferred to said coil; and
- a power control circuit coupled to said detector means and to said amplifying means for controlling the gain of said amplifying means to maintain a desired output power for said coil.

16. The circuit as defined in claim 15 wherein said amplifying means includes trap circuit means for filtering harmonic frequency signals of at least one of s id first and second frequency signals.

17. The circuit as defined in claim 16 and further including a plasma torch; a spray chamber coupled to said torch; a sample nebulizer coupled to said spray chamber; a cabinet for housing said torch, spray chamber, nebulizer and said induction coil; said cabinet including an optical path aligned with said torch; an optical spectrometer mounted to receive optical information through said path; and means for moving one of said torch assembly and spectrometer with respect to the other such that said spectrometer can view different portions of a plasma generated in said torch.

18. The circuit as defined in claim 17 wherein said moving means comprises means for moving said cabinet with respect to said spectrometer.

19. A plasma generator comprising:
- a plasma torch;
- an induction coil coupled to said torch and including terminals for receiving activating electrical R.F. power; and
- means for providing activating R.F. power to said terminals of said induction coil, said providing means including an R.F. oscillator, a power amplifier coupled to said oscillator, and a power control circuit coupled to said power amplifier, and ignition detecting means for monitoring an R.F. field near said induction coil and for applying signals representative thereof to said power control circuit which responds thereto to optimize the ignition of the plasma by said torch.

20. A plasma generator comprising;
- a plasma torch;
- an induction coil coupled to said torch and including terminals for receiving activating electrical signals;
- means for providing activating power to said terminals of said induction coil, said providing means including a power amplifier and a power control circuit coupled to said power amplifier; and
- monitoring means for monitoring the forward and reflected power applied to said torch, said monitoring means coupled to said power control circuit for applying signals representative thereof to said power control circuit which responds thereto to prevent excessive power dissipation in said power amplifier according to the equation:

$$I \leq P_{for}/V + P_{dist}/V - P_{rev}/V$$

where I is the drive current to said coil; V is the voltage at said coil; Pfor is the forward applied power; Pdist is the power which can be dissipated by said power amplifier, and Prev is the power returned to said power amplifier due to an impedance mismatch.

* * * * *

UNITED STATES PATENT AND TRADEMARK OFFICE
CERTIFICATE OF CORRECTION

PATENT NO. : 5,155,547
DATED : October 13, 1992
INVENTOR(S) : Ted J. Casper et al.

It is certified that error appears in the above-identified patent and that said Letters Patent is hereby corrected as shown below:

Column 5, line 48:
    "on" should be --one--.

Column 9, line 36; (in formula)
    "*PFOR n" should be --*PFOR^n--.

Column 9, line 37;
    "Z*(25/Vs)*PREV n" should be --Z*(25/Vs)*PREV^n--.

Column 9, line 51;
    "PFOR n" should be --PFOR^n--.

Column 9, line 65;
    "PFOR n" should be --PFOR^n--.

UNITED STATES PATENT AND TRADEMARK OFFICE
CERTIFICATE OF CORRECTION

PATENT NO. : 5,155,547

DATED : October 13, 1992

INVENTOR(S) : Ted J. Casper et al.

It is certified that error appears in the above-identified patent and that said Letters Patent is hereby corrected as shown below:

Column 9, line 68;
"PFOR n" should be --PFOR$^n$--.

Column 13, Claim 16, line 34;
"si d" should be --said--.

Signed and Sealed this

Eleventh Day of January, 1994

Attest:

BRUCE LEHMAN

Attesting Officer

Commissioner of Patents and Trademarks